US006762401B2

(12) United States Patent
Lee (10) Patent No.: US 6,762,401 B2
(45) Date of Patent: Jul. 13, 2004

(54) CMOS IMAGE SENSOR CAPABLE OF INCREASING FILL FACTOR AND DRIVING METHOD THEREOF

(75) Inventor: Jae-Dong Lee, Ichon-shi (KR)

(73) Assignee: Hynix Semiconductor, Inc., Gyunggi-do (KR)

( * ) Notice: Subject to any disclaimer, the term of this patent is extended or adjusted under 35 U.S.C. 154(b) by 43 days.

(21) Appl. No.: 10/205,696

(22) Filed: Jul. 26, 2002

(65) Prior Publication Data

US 2003/0020002 A1 Jan. 30, 2003

(30) Foreign Application Priority Data

Jul. 27, 2001 (KR) ........................................ 2001-45424

(51) Int. Cl.⁷ ............................................. H01L 27/00
(52) U.S. Cl. ................... 250/208.1; 250/214 R
(58) Field of Search ................... 250/208.1, 214 R, 250/214.1; 257/290, 291, 431, 440; 348/272, 294

(56) References Cited

U.S. PATENT DOCUMENTS 5,909,026 A * 6/1999 Zhou et al. ............... 250/208.1
6,570,144 B1 * 5/2003 Lee et al. ................. 250/208.1

* cited by examiner

Primary Examiner—Que T. Le
(74) Attorney, Agent, or Firm—Marshall, Gerstein & Borun LLP (57) ABSTRACT

The present invention relates to a complementary metal-oxide-semiconductor (CMOS) image sensor, comprising: a plurality of unit pixel arrayed in rows and columns, wherein the unit pixel including: (a) a charge generating means for generating charges in response to lights reflected from an object; (b) a first reset transistor for resetting the charge generating means; (c) a floating diffusion region receiving the charges from the charge generating means; and (d) a transfer transistor for receiving an address signal to transfer the charges from the charge generation means to the floating diffusion region; and a plurality of source following unit, each coupled to each column of unit pixel. And also, the present invention provides a driving method the CMOS image sensor.

11 Claims, 7 Drawing Sheets

CMOS IMAGE SENSOR CAPABLE OF INCREASING FILL FACTOR AND DRIVING METHOD THEREOF

FIELD OF THE INVENTION

The present invention relates to a complementary metal-oxide-semiconductor (CMOS) image sensor; and more particularly, to a CMOS image sensor capable of increasing a fill factor and a driving method thereof.

DESCRIPTION OF RELATED ARTS

A complementary metal-oxide-semiconductor (CMOS) image sensor is a device that converts a photo image into an electric signal. The CMOS image sensor becomes reactive to light and converts signals of electrons into signals of voltages so as to get image information. The CMOS image sensor can be used in any device that displays image, e.g., cameras, medical equipments, surveillance cameras, industrial equipments for detecting and confirming location, toys and so forth. Currently, usages and applications of the CMOS image sensor become progressively broader.

Figure 1:
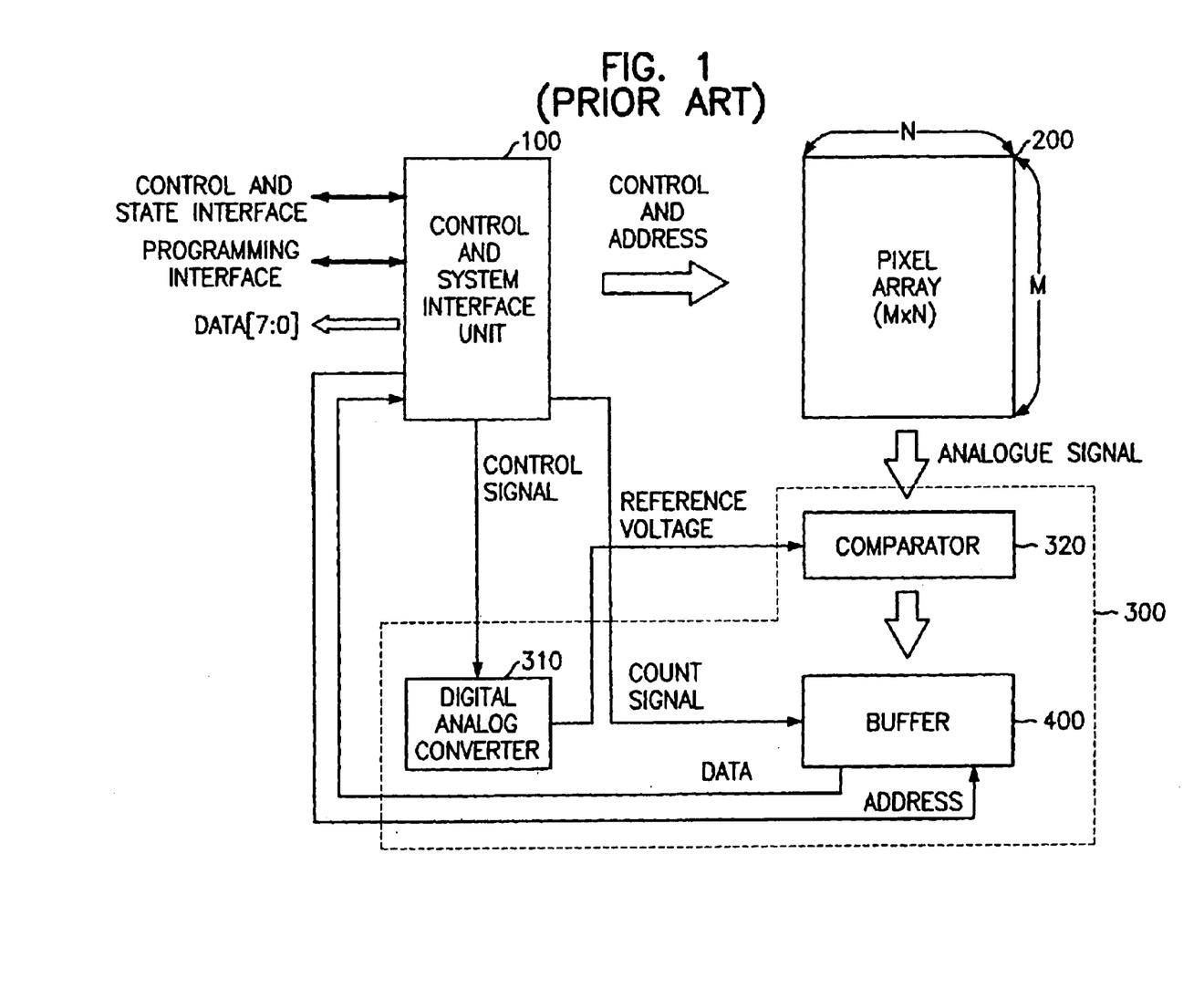
FIG. 1 is a block schematic diagram illustrating the conventional CMOS image sensor.

FIG. 1 is a block diagram illustrating a conventional CMOS image sensor. The CMOS image sensor includes a control and system interface unit 100, a pixel array 200 having a plurality of image sensing elements, and an analog-to-digital converter 300. The analog-to-digital converter 300 includes a digital-analog converter 310 for generating a reference voltage and a comparator 320 for comparing the reference voltage with a analog image data from the pixel array 200 to generator a digital image data, and a buffer 400 for storing the digital image data.

The CMOS image sensor is provided with metal-oxide-semiconductor (MOS) transistors as the same number of pixels and employs a switching mode to detect outputs in an orderly manner by using the MOS transistors. The CMOS image sensor, compared to a most generally used conventional charge coupled device (CCD) image sensor, has a simple operational scheme and is capable of implementing various scanning types. A signal processing circuit for the CMOS image sensor can be integrated into a single chip so that it is possible to miniaturize products. Also, use of compatible CMOS technique provides advantages of reducing manufacturing costs, and providing a reduced power consumption.

Figure 2A:
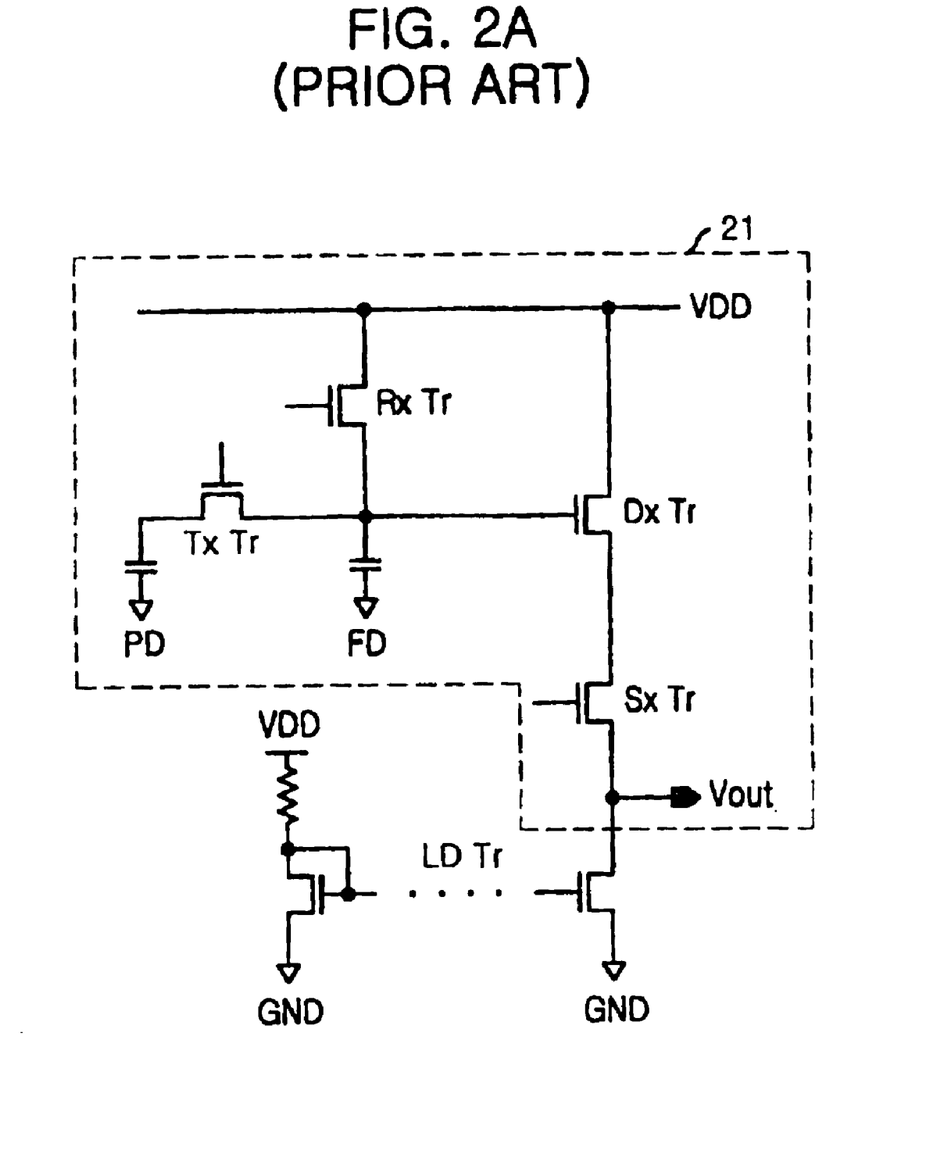
FIGS. 2A and 2B are circuit diagrams illustrating unit pixel structures of a conventional CMOS image sensor.

FIG. 2A is a circuit layout showing a unit pixel 21 of a CMOS image sensor constructed with four transistors and two capacitors, i.e., a photodiode and a floating diffusion region. The unit pixel 21 of the CMOS image sensor having an active pixel structure includes a photodiode PD, a floating diffusion region FD and four NMOS transistors.

The photodiode PD detects photon and generates charges. The floating diffusion region FD stores the charges transferred from the floating diffusion region FD. The four NMOS transistors are a transfer transistor TxTr, a reset transistor RxTr, a driver transistor DxTr and a select transistor SxTr. The transfer transistor TxTr transfers the charges generated and transferred from the photodiode PD to the floating diffusion region FD. The reset transistor RxTr releases the charges stored at the FD to detect signals. The driver transistor DxTr functions as a source follower. The select transistor RxTr is for switching and addressing.

Operational procedures of the unit pixel 21 in the CMOS image sensor are described in below. Firstly, the reset transistor RxTr, the transfer transistor TxTr, and the select transistor SxTr are turned on to reset the unit pixel 21. At this time, the photodiode PD starts to be depleted. Also, the floating diffusion region FD is electrically discharged in proportion to a supplying voltage VDD.

Next, the transfer transistor TxTr is turned off and the select transistor RxTr is turned on. Then, the reset transistor RxTr is turned off. From this series of operation, charges are stored in the photodiode PD by light. Concurrently, voltage of the floating diffusion region FD is read from an output terminal Vout of the unit pixel and is stored in a buffer as a first output voltage "V1". The transfer transistor TxTr is subsequently turned on to transfer the charges of which amount is changed depend on an intensity of light to the floating diffusion region FD. Also, a second output voltage "V2" is read from the output terminal Vout to convert analog data for the voltage difference "V1–V2" into digital data, thereby completing one cycle of the unit pixel operation.

Capacitance of the photodiode $C_p$ and floating diffusion region $C_f$, is very important to achieve a stable operation of the unit pixel. The capacitance $C_p$ of the photodiode PD improves its ability for sensing lights as area becomes larger, but the size of the chip should be increased in proportion to the size of the unit pixel, and the size of a lens used after completing chip packaging processes should be increased. Because of this increased size of the lens, manufacturing costs increased. On the other hand, the capacitance Cf of the floating diffusion region FD is less than that of the capacitance Cp of the photodiode PD. In other words, as the capacitance Cp of the photodiode PD becomes smaller, the sensing ability is enhanced when charges captured in the photodiode PD are transferred to the floating diffusion region FD. However, if the capacitance Cp of the photodiode PD becomes too small, then charge coupling caused by parasitic capacitance formed between a gate and the floating diffusion region FD increase and mismatching ratios between pixels increase, resulting in severe noise. On the other hand, in case that the capacitance Cf of the floating region FD becomes too large, the sensing ability decreases, and thus, voltage ranges that can be used at the output terminal Vout also decreases. That is, a dynamic range of the output voltage decreases.

It is a trend in today to miniaturize the size of pixels to improve a resolution of image; however, the dynamic range of the output voltage is reduced. Although the structure of the active pixel is commonly used to eliminate noise, a fill factor, which is a ratio of an active area to a whole area, i.e., active area and the rest of supporting areas), is not satisfied sufficiently.

As shown in FIG. 2A, a typical structure of the unit pixel has four transistors and two capacitors, of which capacitance is defined by the photodiode PD and the floating diffusion region FP. The area of the photodiode PD decreases relatively as the number of the transistors in the pixel increases. Therefore, the dynamic range of a maximum output voltage of the image sensor declines and sensitivity is also degraded. That is, the unit pixel structure of the conventional image sensor has a lot of transistors and this factor limits the area for the photodiode. Accordingly, the size of die in Mega-level CMOS image sensor should be increased and a development of the CMOS image sensor has many limits. If the size of a pixel is reduced to solve this problem, the photodiode area also decreases and the dynamic range of the output voltage is diminished, resulting in another problem of degrading sensitivity of the CMOS image sensor.

Figure 2B:
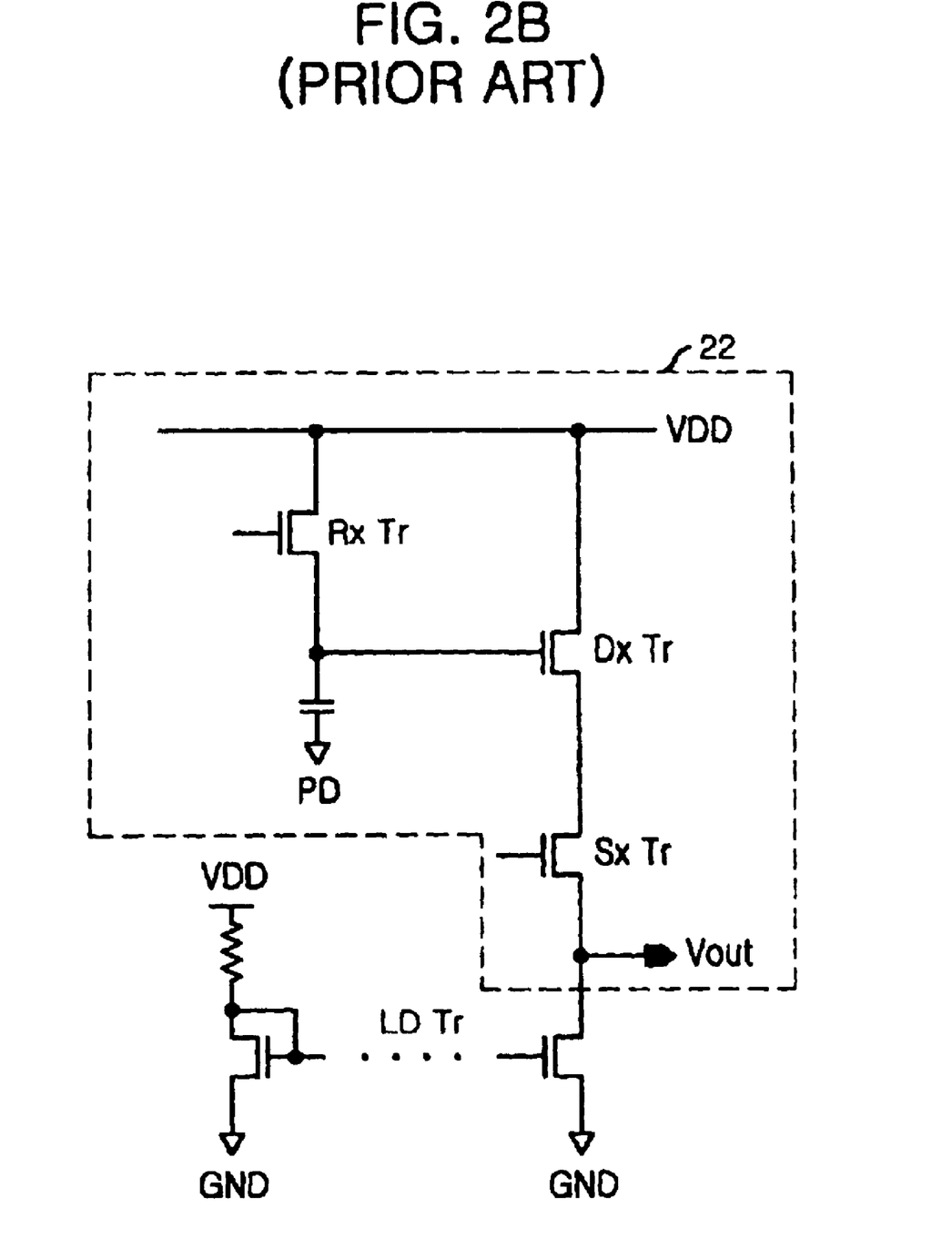

Referring to FIG. 2B, in order to solve the above problems, there is a proposed structure to increase the photodiode area by providing three transistors and one capacitor of which capacitance is defined by a photo diode PD in a unit pixel 22. However, since this structure uses a signal change of the photodiode PD as an output, it becomes worse than the structure constructed with four transistors and two capacitors. Also, a match ratio between pixel arrays is degraded because an initial state of the photodiode PD before a sensing procedure, that is, pinning, is determined with only one transistor.

SUMMARY OF THE INVENTION

It is an object of the present invention to provide a CMOS image sensor, capable of increasing a fill factor and a dynamic range of an output voltage, reducing noises, prevent from a match ration be degraded.

It is another object of the present invention to provide a driving method of the CMOS image sensor.

In accordance with an aspect of the present invention, there is provided a complementary metal-oxide-semiconductor (CMOS) image sensor, comprising: a plurality of unit pixel arrayed in rows and columns, wherein the unit pixel including: (a) a charge generating means for generating charges in response to lights reflected from an object; (b) a first reset transistor for resetting the charge generating means; (c) a floating diffusion region receiving the charges from the charge generating means; and (d) a transfer transistor for receiving an address signal to transfer the charges from the charge generation means to the floating diffusion region; and a plurality of source following unit, each coupled to each column of unit pixel.

In accordance with another aspect of the present invention, there is also provided a driving method for implementing a complementary metal-oxide-semiconductor (CMOS) image sensor including a photodiode, a floating diffusion region, a reset transistor for resetting the photodiode, and a transfer transistor for receiving an address signal and to transfer the charges from the photodiode to the floating diffusion region in a unit pixel, and including a driver transistor in a source following, each coupled to each column of unit pixels, the driving method comprising: turning on the transfer transistor and reset transistor to induce the photodiode into a depletion state, wherein a gate of the transfer transistor receives; turning off the transfer transistor, the reset transistor, and storing an output voltage of the floating diffusion region into a register assigned to each column as reference data through the driver transistor; turning on the transfer transistor, transferring the charges stored at the photodiode to the floating diffusion region and storing variably changing electric potentials of the floating diffusion region into a register assigned to each column as image data through the driver transistor; and displaying actual data obtained from the image data and the reference data.

In accordance with still another aspect of the present invention, there is also provided a driving method for implementing a complementary metal-oxide-semiconductor (CMOS) image sensor including a photodiode, a floating diffusion region, a first reset transistor for resetting the photodiode, a second reset transistor for resetting the floating diffusion region, and a transfer transistor for receiving an address signal and to transfer the charges from the photodiode to the floating diffusion region in a unit pixel, and including a driver transistor in a source following unit, each coupled to each column of unit pixels, the driving method comprising: turning on the transfer transistor, first reset transistor and the second reset transistor to induce the photodiode into a depletion state, wherein a gate of the transfer transistor receives; turning off the transfer transistor, the first and second reset transistors, and storing an output voltage of the floating diffusion region into a register assigned to each column as reference data through the driver transistor; turning on the transfer transistor, transferring the charges stored at the photodiode to the floating diffusion region and storing variably changing electric potentials of the floating diffusion region into a register assigned to each column as image data through the driver transistor; and displaying actual data obtained from the image data and the reference data.

The present invention provides a CMOS image sensor having fewer transistors in an unit pixel than the conventional the CMOS image sensor having four transistors in an unit pixel, and having a sufficient fill factor. Also, the present invention provides a CMOS image sensor having an active pixel structure and a source follower circuit correspondently assigned to each column, thereby dampening a noise effect.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

In accordance with one preferred embodiment of the present invention, a unit pixel of a CMOS image sensor can be formed with two transistors and two capacitors, i.e. a photodiode and a floating diffusion region, to secure required area of the photodiode and uses one source follower as per one column so to achieve a maximum effect of reducing noises. The two transistors are a transfer transistor and a reset transistor. The transfer transistor transfers charges generated by light at the photodiode to the floating diffusion region and a gate of the transfer transistor receives an address signal.

Figure 3:
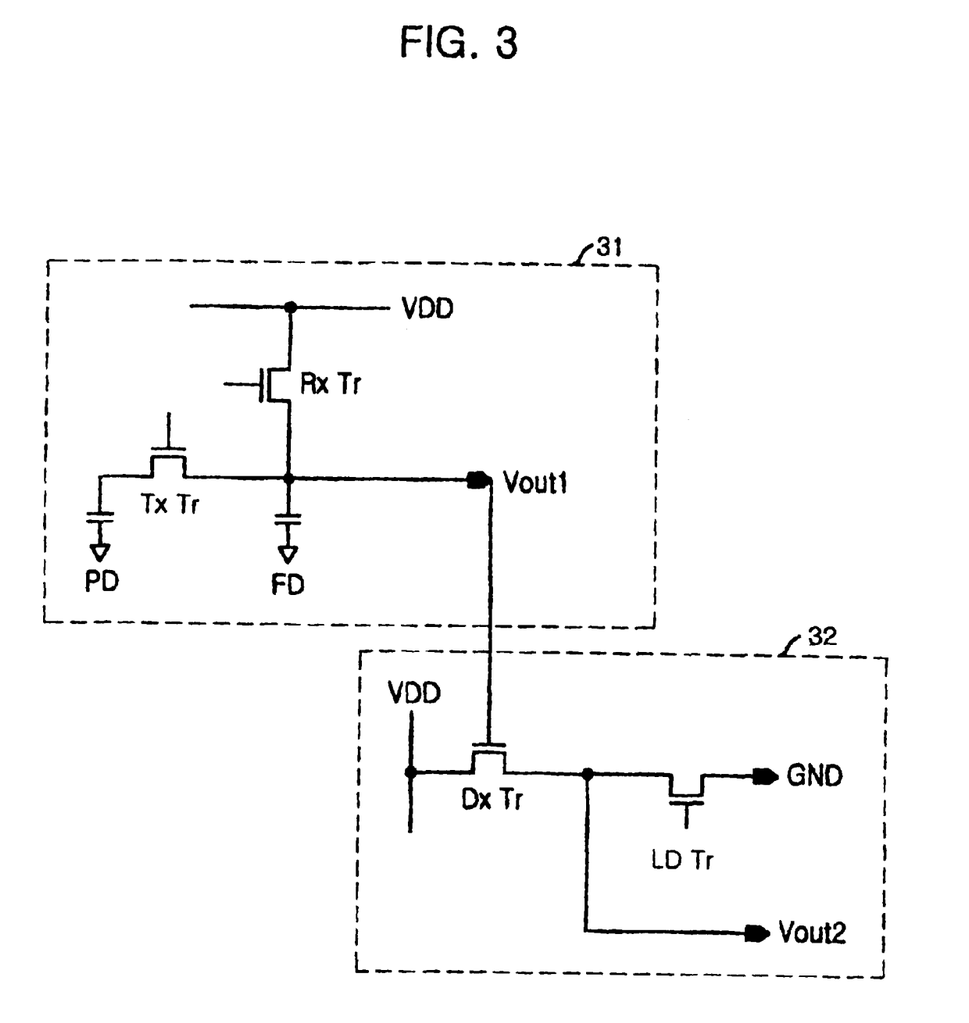
FIG. 3 is a circuit diagram depicting a unit pixel structure of a CMOS image sensor including three transistors and two capacitors in a unit pixel in accordance with an embodiment of the present invention.

Referring to FIG. 3, the CMOS image sensor and the driving method will be described in accordance with one embodiment of the present invention.

A unit pixel 31 of the CMOS image sensor includes a photodiode PD, a floating diffusion region FD, a reset transistor RxTr and a transfer transistor TxTr. The photodiode PD receives light and generate charges. The floating diffusion region FD receives charges stored at the photodiode PD. The reset transistor RxTr includes a first junction connected to a power supply(not shown) providing a supplying voltage VDD and a second junction connected to the floating diffusion region FD. The transfer transistor TxTr includes a first junction connected to the photodiode PD and a second junction connected to the floating diffusion region FD so to transfer the charges stored at the photodiode PD to the floating diffusion region FD. A plurality of the unit pixel 31 are arrayed in rows and columns.

The unit pixel arrayed in the same column is connected with a source follower 32. The source follower includes a driver transistor DxTr. The driver transistor DxTr includes a gate for receiving the voltage of the floating diffusion region FD through a unit pixel output terminal Vout1, a first junction connected to the power supply providing the supplying voltage VDD and a second junction connected to a column output terminal Vout2. That is, the pixels arrayed in the same column share the same driver transistor DxTr. Also, the source follower 32 further includes a load transistor LD-Tr having a first junction connected to the second junction of the driver transistor and a second junction grounded.

Operation of the CMOS image sensor, shown in FIG. 3, starts with initialization of the photodiode PD by turning on the transfer transistor TxTr and the reset transistor RxTr. Namely, the photodiode PD is turned to a pinning state, i.e., the photodiode is depleted by transferring all of the charges stored at the photodiode PD to the floating diffusion region FD.

Next, the transfer transistor TxTr and the reset transistor RxTr are simultaneously turned off and a voltage at the column output terminal Vout2 is stored as a reference value into a register assigned to each column.

Figure 4A:
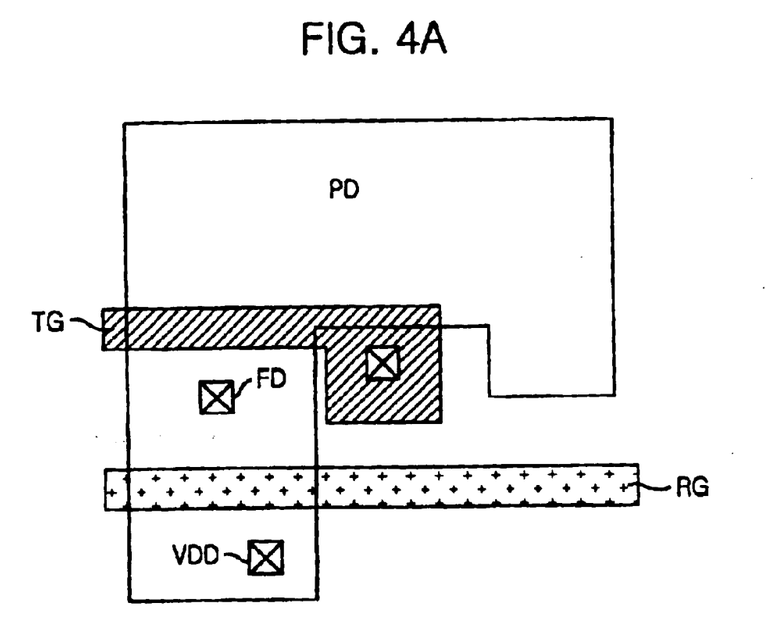
FIGS. 4A and 4B are plane views showing a layout of the unit pixel of the CMOS image sensor illustrated in FIG. 3.
Figure 4B:
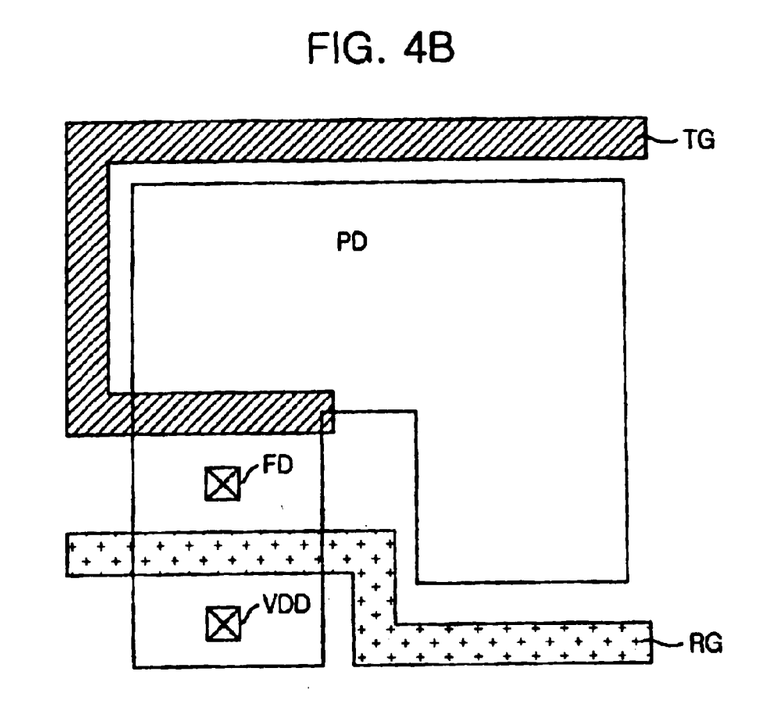

After turning off the transfer transistor TxTr and the reset transistor RxTr, certain duration of the time is set to allow the photodiode PD to store a certain amount of charges. Then, the transfer transistor TxTr is turned on to transfer the charges stored at the photodiode PD to the floating diffusion region FD. Because of this transfer of the charges, an electric potential of the floating diffusion region FD is changed. The electric potential change of the floating diffusion region FD is then stored as image data through the source follower 32. Next, an image processing such as the correlated double sampling (CDS) is performed to process using the image data and the reference data as actual signals, eby an image being displayed. FIGS. 4A and 4B are plane views illustrating construction of the CMOS image sensor explained in FIG. 3. In FIGS. 4A and 4B, 'TG' and 'RG' are denotes gate electrode of the transfer transistor and the reset transistor, respectively.

Figure 5:
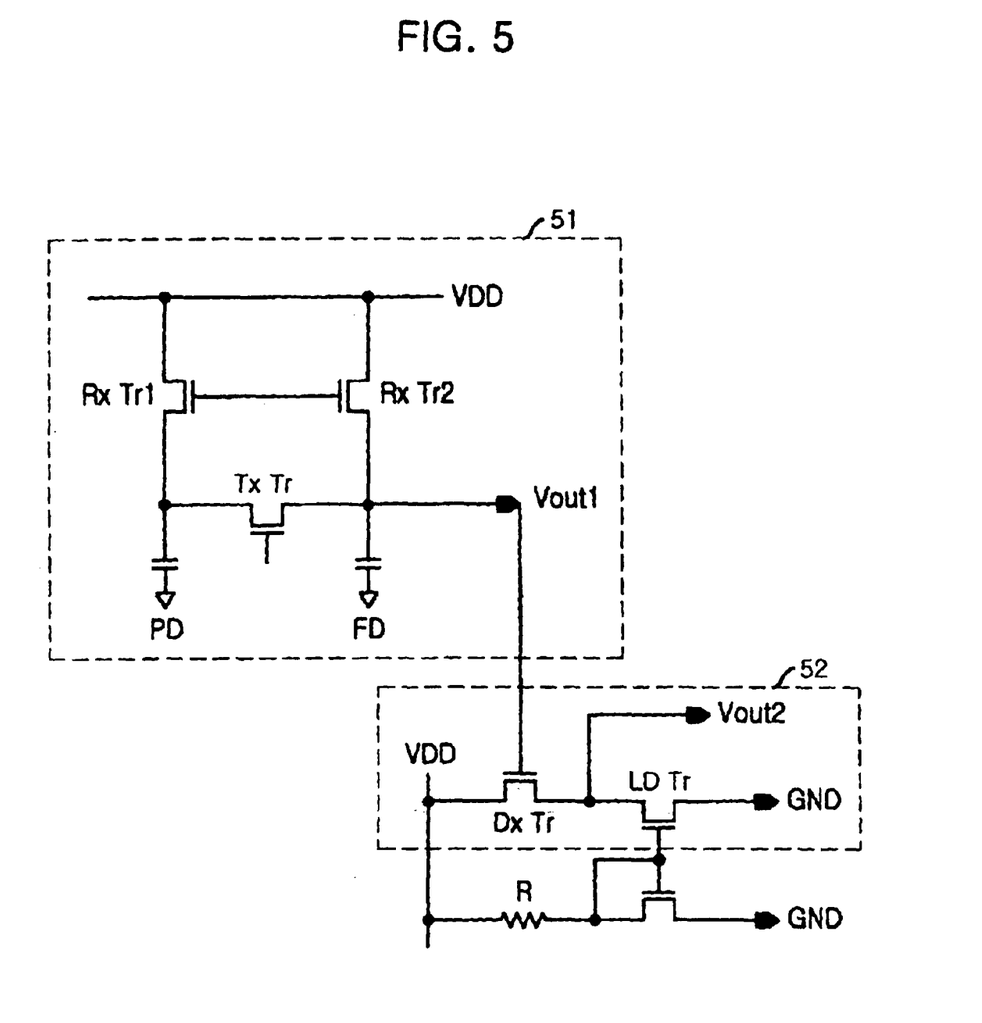
FIG. 5 is a circuit layout diagram depicting the unit pixel structure of the CMOS image sensor including two transistors and two capacitors in a unit pixel in accordance with the present invention.

Referring to FIG. 5, there are described the CMOS image sensor and a driving method for driving the CMOS image sensor in accordance with the another preferred embodiment of the present invention.

A unit pixel 51 includes three transistors and two capacitors in a unit pixel. The three transistors are a first reset transistor RxTr1, a second reset transistor RxTr2 and a transfer transistor TxTr. The transfer transistor transfers charges generated at a photodiode PD, i.e. a first capacitor, to a floating diffusion region FD, i.e. a second capacitor, and the first and second reset transistors reset the photodiode PD into an initial state.

In the photodiode PD, charges are generated from light incident thereto. The floating diffusion region FD receives charges stored at the photodiode PD. The first reset transistor RxTr1 including a gate coupled to a gate of the second reset transistor, a first junction connected to a power supply(not shown) providing a supplying voltage VDD and a second junction connected to the photodiode PD. The second reset transistor RxTr2 of which the gate is coupled to the first reset transistor RxTr1 including a first junction connected to the power supply providing a supplying voltage VDD, and a second junction connected to the floating diffusion region FD, respectively. The transfer transistor TxTr includes a gate receiving an address signal, a first junction connected to the photodiode PD and a second junction connected to the floating diffusion region so to transfer charges stored at the photodiode PD to the floating diffusion region FD.

Compared to the conventional CMOS image sensor that uses a select transistor for addressing, the CMOS image sensor in accordance with the present invention uses the transfer transistor for addressing in addition to transferring charges to the floating diffusion region FD. Also, it is possible for the transfer transistor to be set as the reset transistor at a digital block for addressing.

The initial state of the photodiode PD is determined by the two reset transistors RxTr1, RxTr2 to increase a pinning effect.

The unit pixel structured as the above is arrayed in rows and columns. The unit pixel arrayed in the same column is connected with a source follower 52. The source follower includes a driver transistor DxTr. The driver transistor includes a gate for receiving the voltage of the floating diffusion region FD through a unit pixel output terminal Vout1, a first junction connected to the power supply providing the supplying voltage VDD and a second junction connected to a column output terminal Vout2. That is, the pixels arrayed in the same column share the same driver transistor DxTr. Also, the source follower 52 further includes a load transistor LD-Tr having a first junction connected to the second junction of the driver transistor and a second junction grounded. The gate of the load transistor can be coupled to a gate of a transistor Tr including a first junction connected to a resistor R dropping the supplying voltage VDD and a second junction grounded. A signal change that can occur due to operational variations of the source follower circuit located in between pixels can be minimized, thereby ultimately dampening a noise effect.

Driving the CMOS image sensor, shown in FIG. 5, starts with initialization of the photodiode PD by turning on the transfer transistor TxTr, the first reset transistor RxTr1 and the second reset transistor RxTr2. Namely, the photodiode PD is turned to a pinning state, i.e., the photodiode is depleted.

After this step of initialization, the transfer transistor TxTr, the first and the second reset transistors RxTr1 and RxTr2 are turned off and a voltage at the column output terminal Vout2 is stored as a reference value into a register assigned to each column.

After turning off the transfer transistor TxTr, the first reset transistor RxTr1 and the second reset transistor RxTr2, certain duration of the time is set to allow the photodiode PD to store a certain amount of charges. Once collecting a sufficient amount of the charges, the transfer transistor TxTr is turned on to transfer the charges from the photodiode PD to the floating diffusion region FD. At this time, electric potential changes of the floating diffusion region FD are stored into a register assigned to each column.

Next, an image processing such as the correlated double sampling (CDS) is performed to process using the image data and the reference data as actual signals, so that an image is then displayed.

With the CMOS image sensor in accordance with the present invention, noises originated from the source follower 52 itself can be minimized since a preset amount of the current from the load transistor LDTr is generated as per a column and directly transferred to the driver transistor DxTr. Hence, the preset amount of the current is obtained at the column output terminal Vout2 to be signally processed by a subsequent CMOS processing.

Although it is dominantly used to decrease the number of gates for increasing a fill factor in a unit pixel, it is also important to reduce the number of contacts. In other words, the unit pixel of the conventional CMOS image sensor can operate normally when the number of contacts are basically three or more than two, whereas the unit pixel of the present invention can be operated even with two contacts.

Figure 6A:
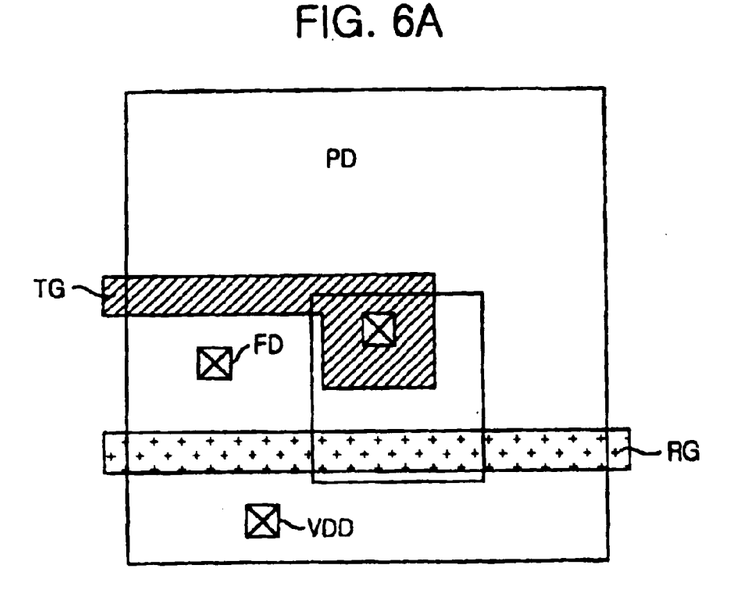
FIGS. 6A and 6B are plane views showing a layout of the unit pixel of the CMOS image sensor illustrated in FIG. 5.
Figure 6B:
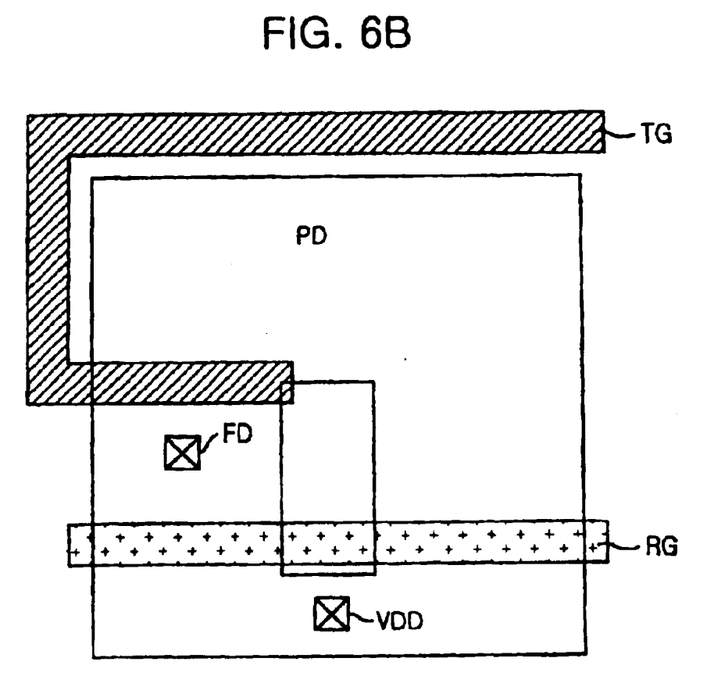

This reduced number of contacts gives an advantage in integration. Although there are three transistors in the present invention, two reset transistors RxTr1, RxTr2 share the identical gate. Therefore, in layout perspectives, the inventive CMOS image sensor can be seen as having two transistors as shown in FIGS. 6A and 6B. In FIGS. 6A and 6B, 'TG' and 'RG' denote gate electrode of the transfer transistor and the reset transistor, respectively.

With the CMOS image sensor in accordance with the present invention, it is possible to provide an advantage that a resolution of the CMOS image sensor can be enhanced with the same size of the conventional CMOS image sensor. That is, since it is not necessary for the inventive CMOS image sensor of the present invention to have a separate transistor in the unit pixel for addressing, the size of a logic control block can be reduced, and in turn, it is possible to simplify a logic control circuit of the CMOS image sensor. In comparison with the conventional CMOS image sensor, the present invention is advantageous in setting a duration time since it is merely required to only set the duration time of the reset transistor and the transfer transistor. Also, a longer actual sensing time results in a rapid image conversion over the same whole duration time. Therefore, it is possible to provide moving pictures by increasing a frame rate of the CMOS image sensor. In addition, sensitivity is also improved because of an increase in a dynamic range of an output voltage with respect to the same frame rate. Also, since one source follower is formed as per one column, it is possible to minimize any change occurring between pixel arrays in a source follower circuit, and thus, improve credibility. Furthermore, the pixel arrays can be used in a high-resolution state so that various forms of arrays can be constructed. In other words, by establishing only one source follower as per the unit pixel, gain variation of the source follower is minimized to reduce the noise effect. Particularly, as described in the preferred embodiment of the present invention, only reset transistors are used, thereby reducing the time for initializing the photodiode.

While the present invention has been described with respect to certain preferred embodiments, it will be apparent to those skilled in the art that various changes and modifications can be made without departing from the scope of the invention as defined in the following claims.

What is claimed is:

1. A complementary metal-oxide-semiconductor (CMOS) image sensor, comprising:
   a plurality of unit pixels arrayed in rows and columns, wherein the unit pixel including:
   (a) a charge generating means for generating charges in response to lights reflected from an object;
   (b) a first reset transistor for resetting the charge generating means;
   (c) a floating diffusion region for forming a capacitor having a capacitance to receive the charges from the charge generating means, wherein the capacitance increases a dynamic range of an output voltage; and
   (d) a transfer transistor for receiving an address signal to transfer the charges from the charge generating means to the floating diffusion region; and
   a plurality of source following unit, each coupled to each column of unit pixel.

2. The CMOS image sensor as recited in 1, wherein the source following unit includes a driver transistor, the driver transistor having:
   a gate being inputted with an output of the floating diffusion region;
   a first junction being connected to a power supplying unit; and
   a second junction being connected an output terminal.

3. The CMOS image sensor as recited in 2, further comprises a second reset transistor for resetting the floating diffusion region.

4. The CMOS image sensor as recited in 1, wherein the first reset transistor includes a first junction connected to a power supplying unit and a second junction is connected to the photodiode.

5. The CMOS image sensor as recited in 4, wherein the second reset transistor includes a first junction connected to a power supplying unit and a second junction is connected to the photodiode.

6. The CMOS image sensor as recited in 4, wherein gates of the first and second reset transistors are coupled with each other.

7. The CMOS image sensor as recited in 1, wherein the transfer transistor includes a first junction connected to the charge generating means and a second junction connected to the floating diffusion region.

8. The CMOS image sensor as recited in claim 2, wherein source following unit further includes a load transistor having a first junction connected to the second junction of the driver transistor and a second junction ground.

9. The CMOS image sensor as recited in claim 1, wherein the charge generating means is a photodiode.

10. A driving method for implementing a complementary metal-oxide-semiconductor (CMOS) image sensor including a photodiode, a floating diffusion region for forming a capacitor having a capacitance to receive the charges from the charge generating means, wherein the capacitance increases a dynamic range of an output voltage, a reset transistor for resetting the photodiode, and a transfer transistor for receiving an address signal and to transfer the charges from the photodiode to the floating diffusion region in a unit pixel, and including a driver transistor in a source following, each coupled to each column of unit pixels, the driving method comprising:
   turning on the transfer transistor and reset transistor to induce the photodiode into a depletion state, wherein a gate of the transfer transistor receives;
   turning off the transfer transistor, the reset transistor, and storing an output voltage of the floating diffusion region into a register assigned to each column as reference data through the driver transistor;
   turning on the transfer transistor, transferring the charges stored at the photodiode to the floating diffusion region and storing variably changing electric potentials of the floating diffusion region into a register assigned to each column as image data through the driver transistor; and
   displaying actual data obtained from the image data and the reference data.

11. A driving method for implementing a complementary metal-oxide-semiconductor (CMOS) image sensor including a photodiode, a floating diffusion region for forming a capacitor having a capacitance to receive the charges from the charge generating means, wherein the capacitance increases a dynamic range of an output voltage, a first reset transistor for resetting the photodiode, a second reset transistor for resetting the floating diffusion region, and a transfer transistor for receiving an address signal and to transfer the charges from the photodiode to the floating diffusion region in a unit pixel, and including a driver transistor in a source following unit, each coupled to each column of unit pixels, the driving method comprising:

turning on the transfer transistor, first reset transistor and the second reset transistor to induce the photodiode into a depletion state, wherein a gate of the transfer transistor receives;

turning off the transfer transistor, the first and second reset transistors, and storing an output voltage of the floating diffusion region into a register assigned to each column as reference data through the driver transistor;

turning on the transfer transistor, transferring the charges stored at the photodiode to the floating diffusion region and storing variably changing electric potentials of the floating diffusion region into a register assigned to each column as image data through the driver transistor; and displaying actual data obtained from the image data and the reference data.

* * * * *

UNITED STATES PATENT AND TRADEMARK OFFICE
CERTIFICATE OF CORRECTION

PATENT NO.    : 6,762,401 B2
DATED         : July 13, 2004
INVENTOR(S)   : Jae-Dong Lee It is certified that error appears in the above-identified patent and that said Letters Patent is hereby corrected as shown below:

<u>Title page,</u>
Item [75], Inventor, please delete "Ichon-shi" and replace with -- Kyoungki-do --.

Signed and Sealed this

Fourteenth Day of December, 2004

JON W. DUDAS
*Director of the United States Patent and Trademark Office*